United States Patent [19]
Kosaka

[11] Patent Number: 5,517,048
[45] Date of Patent: May 14, 1996

[54] PAD STRUCTURE WITH PARASITIC MOS TRANSISTOR FOR USE WITH SEMICONDUCTOR DEVICES

[75] Inventor: Yasumasa Kosaka, Kunitachi, Japan

[73] Assignee: VLSI Technology, Inc., San Jose, Calif.

[21] Appl. No.: 97,417

[22] Filed: Jul. 23, 1993

[51] Int. Cl.$^6$ .................................................. H01L 23/62
[52] U.S. Cl. .......................................... 257/355; 257/357
[58] Field of Search ...................................... 257/335, 337, 257/355, 357

[56] References Cited

U.S. PATENT DOCUMENTS

| | | |
|---|---|---|
| 4,789,917 | 12/1988 | Miller . |
| 4,929,350 | 5/1989 | Miller . |
| 4,937,471 | 6/1990 | Park et al. . |
| 5,151,767 | 9/1992 | Wong ........................................ 257/335 |
| 5,329,143 | 7/1994 | Chan et al. ............................... 257/357 |

OTHER PUBLICATIONS

Patent Abstracts of Japan vol. 14, No. 194 (E-0919) 20 Apr. 1990 & JP, A, 02049960 (NCC) 9 Feb. 1990.
Patent Abstracts of Japan vol. 16, No. 130 (E-1184) 2 Apr. 1992 & JP, A, 03291970 (Fujitsu) 24 Dec. 1991.
Ajiki Tsuneo, "Reliability of IC Device", Nikkagiren Publishing, k.k., Jul. 1988 (third printing, May 1991), p. 282.

Toshiba IC Reliability Handbook, Nov. 1987, p. 130.

*Primary Examiner*—Sara W. Crane
*Assistant Examiner*—S. V. Clark
*Attorney, Agent, or Firm*—Douglas L. Weller

[57] ABSTRACT

An ESD protection device for protecting semiconductor devices from electrostatic discharge includes a metal pad of the semiconductor device, a first charge sink, and a first MOS transistor. The first MOS transistor is placed under the metal pad. The first MOS transistor is coupled as a switch between the first charge sink and the metal pad. In addition, the metal pad operates as a gate of the first MOS transistor. Upon static electricity of a high magnitude of voltage being placed on the metal pad, the first MOS transistor turns on and the static electricity is discharged to the first charge sink.

11 Claims, 2 Drawing Sheets

5,517,048

PAD STRUCTURE WITH PARASITIC MOS TRANSISTOR FOR USE WITH SEMICONDUCTOR DEVICES

BACKGROUND

This invention relates generally to the protection of semiconductor devices from electrostatic discharge by the use of pad structures with parasitic metal oxide semiconductor (MOS) transistors.

Electrostatic discharge (ESD) can be a source of destruction for semiconductor devices. Various schemes have been utilized to offer protection against ESD. For example, see Ajiki Tsuneo, "Reliability of IC Device", Nikkagiren Publishing, k.k., July 1988 (third printing, May 1991), page 282, and see Toshiba IC Reliability Handbook, November 1987, page 130 available from Toshiba, k.k. Toshiba Bldg., Shibaura 1-1-1, Minato-ku, Tokyo 105.

SUMMARY OF THE INVENTION

In accordance with the preferred embodiment of the present invention, there is presented an ESD protection device for protecting semiconductor devices from electrostatic discharge. The ESD protection device includes a metal pad of the semiconductor device, a first charge sink, and a first MOS transistor. The first MOS transistor is placed under the metal pad. The first MOS transistor is coupled as a switch between the first charge sink and the metal pad. In addition, the metal pad operates as a gate of the first MOS transistor. Upon static electricity of a high magnitude of voltage being placed on the metal pad, the first MOS transistor turns on and the static electricity is discharged to the first charge sink.

In the preferred embodiment, the ESD protection device additionally includes a second charge sink and a second MOS transistor. The second MOS transistor is also placed under the metal pad of the semiconductor device. The second MOS transistor is connected as a switch between the second charge sink and the metal pad. In addition, the metal pad operates as a gate of the second MOS transistor. Upon static electricity of a high magnitude of voltage being placed on the metal pad, the second MOS transistor turns on and the static electricity is discharged to the second charge sink. For example, the first MOS transistor is p-channel, the first charge sink is VDD, the second MOS transistor is n-channel and the second charge sink is ground.

The present invention has the advantage of providing efficacious protection against both positive and negative electric charge. In addition, the present invention allows for efficient utilization of space as the ESD protection device is primarily located under a metal pad of a semiconductor device.

DESCRIPTION OF THE PREFERRED EMBODIMENT

Figure 1:
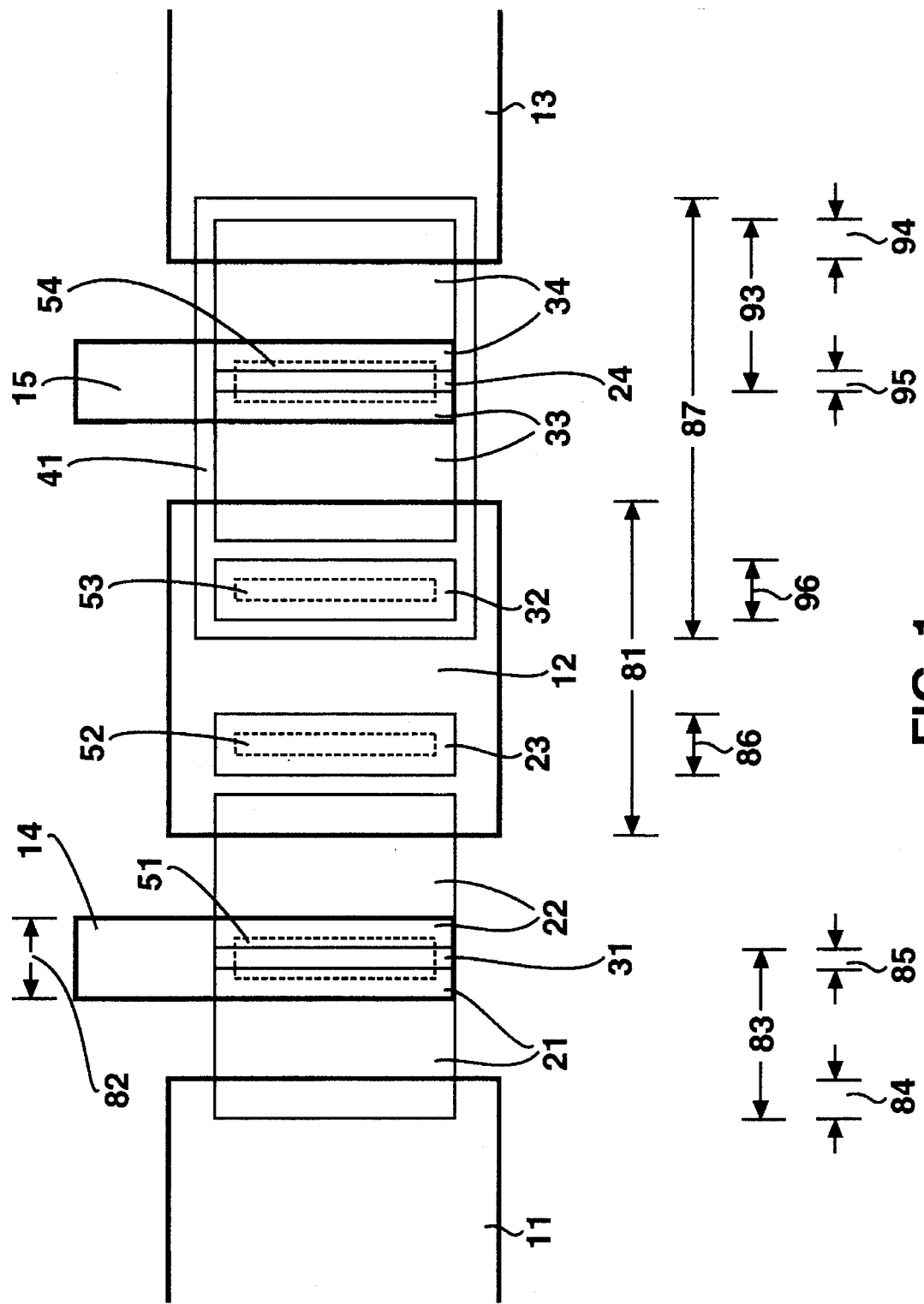
FIG. 1 is a diagram, not to scale, showing a top view of a pad structure of a semiconductor with parasitic MOS transistors used for ESD protection in accordance with the preferred embodiment of the present invention.

FIG. 1 shows a top view, not to scale, of a pad structure of a semiconductor with parasitic MOS transistors used for ESD protection in accordance with the preferred embodiment of the present invention. A metal pad 11, a metal pad 12 and a metal pad 13 are shown. Each pad has a width of, for example, 100 micrometers. A metal region 14 is connected to a VDD 71. A metal region 15 is connected to a ground 72. Metal regions 14 and 15 each have a width 82 of, for example, 30 micrometers.

A $p^+$ region 21 and a $p^+$ region 22 each have a width 83 of, for example, 22 micrometers. $P^+$ region 21 extends under metal pad 11 and $p^+$ region 22 extends under metal pad 12 a distance 84 of, for example, 10 micrometers. An $n^+$ region 31 separates $p^+$ region 21 from $p^+$ region 22. $N^+$ region 31 has a width 85 of, for example, 6 micrometers. A $p^+$ region 23 has a width 86 of, for example, 10 micrometers.

A p-well region 41 has a width 87 of, for example, 75 micrometers. Within p-well region 41, an $n^+$ region 34 and an $n^+$ region 33 each have a width 93 of, for example, 22 micrometers. $N^+$ region 34 extends under metal pad 13 and $n^+$ region 33 extends under metal pad 12 a distance 94 of, for example, 10 micrometers. A $p^+$ region 24 separates $n^+$ region 34 from $n^+$ region 33. $P^+$ region 24 has a width 95 of, for example, 6 micrometers. An $n^+$ region 32 has a width 96 of, for example, 10 micrometers.

A metal contact region 51 connects metal region 14 to $p^+$ region 21, a $p^+$ region 22 and $n^+$ region 31. A metal contact region 52 connects metal pad 12 to $p^+$ region 23. A metal contact region 53 connects metal pad 12 to $n^+$ region 32. A metal contact region 54 connects metal region 15 to $n^+$ region 33, a $n^+$ region 34 and $p^+$ region 24.

Figure 2:
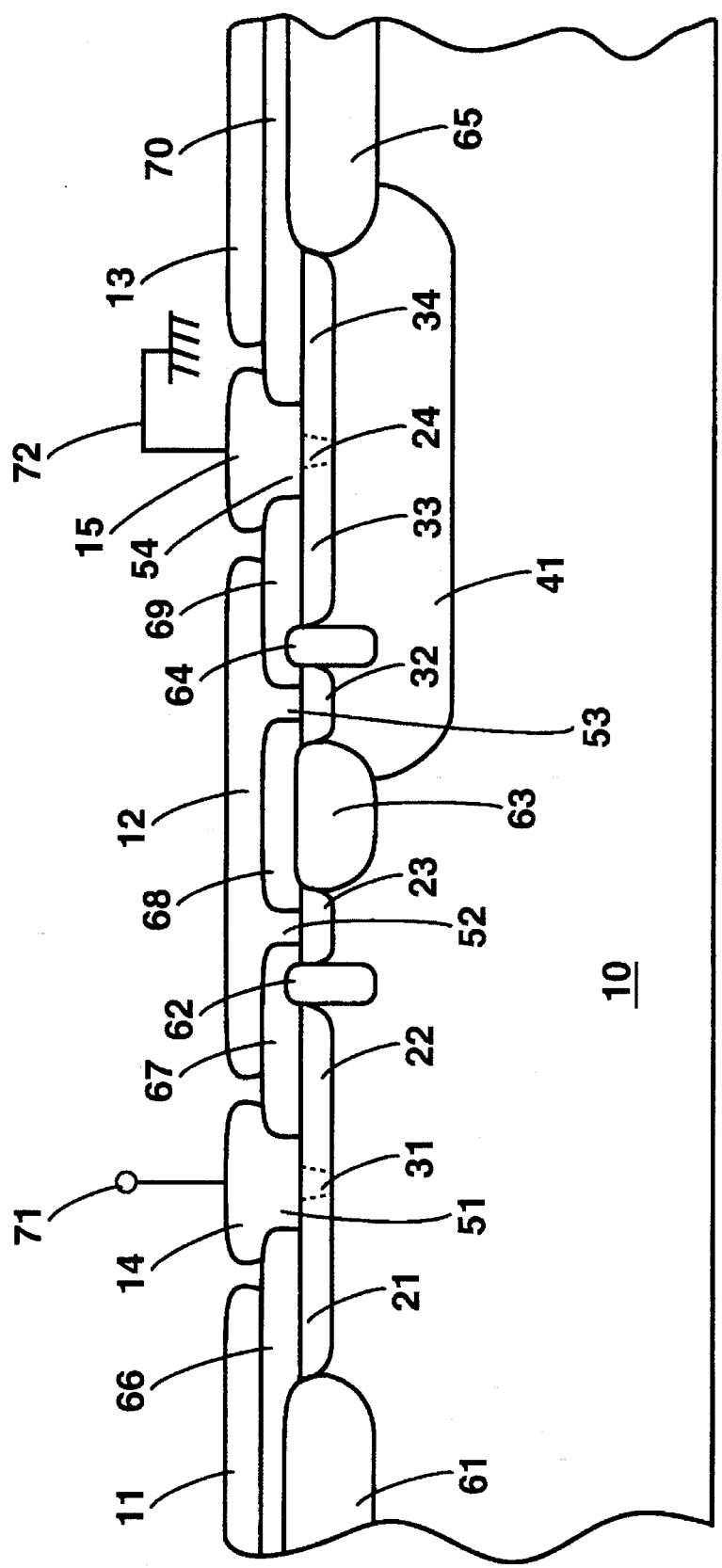
FIG. 2 is a diagram, not to scale, showing a cross section of the pad structure shown in FIG. 1, in accordance with the preferred embodiment of the present invention.

FIG. 2 shows a cross-sectional view of the pad structure shown in FIG. 1. $P^+$ regions 21, 22, 23 and 24 are, for example, doped with Boron and extend to a depth of 0.35 micrometers below the surface of a substrate 10. Substrate 10 is, for example, is an $n^-$ substrate doped at a concentration level of approximately $1 \times 10^{16}$ per centimeter$^3$. $N^+$ regions 31, 32, 33 and 34 each are, for example, doped with Arsenic and extend to a depth of 0.25 micrometers below the surface of substrate 10. An insulating region 61, an insulating region 62, an insulating region 63, an insulating region 64 and an insulating region 65 are, for example, each composed of thermally grown silicon-oxide. An insulating region 66, an insulating region 67, an insulating region 68, an insulating region 69 and an insulating region 70 are, for example, each composed of deposited silicon-oxide. P-well 41 is composed of p-type material doped, for example, with $10^{15}$ atoms per cubic centimeter. A typical depth of p-well 41 is 4 micrometers.

The parasitic MOS transistors operate as follows. When static electricity of a high magnitude of positive voltage is momentarily placed on metal pad 12, an n-channel is formed from $n^+$ region 32, around insulating region 64, to $n^+$ region 33. This allows for the discharge of the static electricity. Likewise, when static electricity of a high magnitude of negative voltage is momentarily placed on metal pad 12, a p channel is formed from $p^+$ region 23, around insulating region 62, to $p^+$ region 22. This allows for the discharge of the negative voltage static electricity of high magnitude.

The foregoing discussion discloses and describes merely exemplary methods and embodiments of the present invention. For example, the discussion of the preferred embodiment describes an embodiment built on a substrate of conductivity type. As will be clearly understood by those skilled in the art, an embodiment could also be built on a substrate of p conductivity type. In such a case well 41 would be of n-conductivity type, regions 21, 22, 23 and 24 would be of $n^+$ conductivity type and regions 31, 32, 33 and 34 would be of $p^+$ conductivity type.

Therefore, as will be understood by those familiar with the art, the invention may be embodied in other specific forms without departing from the spirit or essential characteristics thereof. Accordingly, the disclosure of the present invention is intended to be illustrative, but not limiting, of the scope of the invention, which is set forth in the following claims.

I claim:

1. A device on an integrated circuit, the device comprising:
   a metal pad which provides electrical connection between the integrated circuit and other apparatus;
   a first contact region of first conductivity type directly under the metal pad;
   a second contact region of first conductivity type, at least partially under the metal pad;
   material of second conductivity type between the first contact region and the second contact region;
   a first conductive connection between the metal pad and the first contact region;
   a first charge sink connected to the second contact region; and,
   first dielectric material placed between the first contact region and the second contact region, placement of the first dielectric material preventing direct electrical connection between the first contact region and the second contact region, wherein a channel of first conductivity type is formed from the first contact region around the first dielectric material to the second contact region when static electricity of a high magnitude of voltage is placed on the metal pad.

2. A device as in claim 1 wherein the first conductivity type is p-type, the second conductivity type is n-type and the static electricity of the high magnitude of voltage is of negative voltage.

3. A device as in claim 1 wherein the first conductivity type is n-type, the second conductivity type is p-type and the static electricity of the high magnitude of voltage is of positive voltage.

4. A device as in claim 3 wherein the material of second conductivity type is a p-well within an n⁻ substrate.

5. An ESD protection device for protecting semiconductor devices from electrostatic discharge comprising:
   a metal pad of the semiconductor device, the metal pad providing electrical connection between the semiconductor device and other apparatus;
   a first charge sink;
   a first MOS transistor under the metal pad of the semiconductor device, the first MOS transistor coupled as a switch between the first charge sink and the metal pad, and additionally, the metal pad operating as a gate of the first MOS transistor so that upon static electricity of a high magnitude of voltage of a first conductivity type being placed on the metal pad, the first MOS transistor turns on and the static electricity is discharged to the first charge sink, the first MOS transistor including
   first dielectric material, a first channel being formed around the first dielectric material when static electricity of a high magnitude of voltage of the first conductivity type is placed on the metal pad.

6. An ESD protection device as in claim 5, additionally comprising:
   a second charge sink; and,
   a second MOS transistor under the metal pad of the semiconductor device, the second MOS transistor coupled as a switch between the second charge sink and the metal pad, and additionally, the metal pad operating as a gate of the second MOS transistor so that upon static electricity of a high magnitude of voltage of a second conductivity type being placed on the metal pad, the second MOS transistor turns on and the static electricity is discharged to the second charge sink, the second MOS transistor including
   second dielectric material, a second channel being formed around the first dielectric material when static electricity of a high magnitude of voltage of the second conductivity type is placed on the metal pad.

7. An ESD protection device as in claim 6, wherein the first MOS transistor is p-channel and the first charge sink is VDD and wherein the second MOS transistor is n-channel and the second charge sink is ground.

8. A device on an integrated circuit, the device comprising:
   a metal pad which provides electrical connection between the integrated circuit and other apparatus;
   a first contact region of first conductivity type directly under the metal pad;
   a second contact region of first conductivity type, at least partially under the metal pad;
   material of second conductivity type between the first contact region and the second contact region;
   a first conductive connection between the metal pad and the first contact region;
   a first charge sink connected to the second contact region;
   first dielectric material between the metal pad and the material of second conductivity type, the first dielectric material being placed so that upon static electricity of a high magnitude of voltage being placed on the metal pad, a channel of first conductivity type is formed from the first contact region through the material of second conductivity type to the second contact region;
   a third contact region of second conductivity type directly under the metal pad;
   a fourth contact region of second conductivity type, at least partially under the metal pad;
   material of first conductivity type between the third contact region and the fourth contact region;
   a second conductive connection between the metal pad and the third contact region;
   a second charge sink connected to the fourth contact region; and,
   second dielectric material between the metal pad and the material of second conductivity type, the second dielectric material being placed so that upon static electricity of a high magnitude of voltage being placed on the metal pad, a channel of second conductivity type is formed from the third contact region through the material of first conductivity type to the fourth contact region.

9. A device as in claim 8 wherein the first conductivity type is p-type, the second conductivity type is n-type and the material of first conductivity type is a p-well within an n⁻ substrate.

10. A device as in claim 8 additionally comprising:
    third dielectric material placed between the first contact region and the second contact region, placement of the third dielectric material preventing direct electrical connection between the first contact region and the second contact region, wherein the channel of first conductivity type is formed from the first contact region around the third dielectric material to the second contact region when static electricity of a high magnitude of voltage is placed on the metal pad.

11. A device as in claim 10 additionally comprising:

fourth dielectric material between the third contact region and the fourth contact region, placement of the fourth dielectric material preventing direct electrical connection between the third contact region and the fourth contact region, wherein the channel of second conductivity type is formed from the third contact region around the fourth dielectric material to the fourth contact region when static electricity of a high magnitude of voltage is placed on the metal pad.

* * * * *